(12) United States Patent
Hori et al.

(10) Patent No.: US 6,605,895 B2
(45) Date of Patent: Aug. 12, 2003

(54) LIGHT-EMITTING ELEMENT

(75) Inventors: Yuji Hori, Nagoya (JP); Tomohiko Shibata, Kasugai (JP); Mitsuhiro Tanaka, Handa (JP); Osamu Oda, Nishikasugai-gun (JP)

(73) Assignee: NGK Insulators, Ltd., Aichi (JP)

( * ) Notice: Subject to any disclaimer, the term of this patent is extended or adjusted under 35 U.S.C. 154(b) by 0 days.

(21) Appl. No.: 10/097,277

(22) Filed: Mar. 15, 2002

(65) Prior Publication Data

US 2002/0167271 A1 Nov. 14, 2002

(30) Foreign Application Priority Data

Mar. 28, 2001 (JP) ......................... 2001-091613

(51) Int. Cl.$^7$ ............................................... H01J 63/04
(52) U.S. Cl. ........................................................ 313/506
(58) Field of Search ................................ 313/498, 406, 313/401, 500, 509, 497, 495

(56) References Cited

U.S. PATENT DOCUMENTS

| | | | | |
|---|---|---|---|---|
| 6,023,124 A | * | 2/2000 | Chuman et al. | 313/310 |
| 6,191,476 B1 | * | 2/2001 | Takahashi et al. | 257/706 |
| 6,235,548 B1 | * | 5/2001 | Ota et al. | 438/46 |
| 6,459,207 B1 | * | 10/2002 | Nomura et al. | 315/169.3 |
| 6,462,357 B1 | * | 10/2002 | Tsai et al. | 257/97 |

* cited by examiner

Primary Examiner—Sandra O'Shea
Assistant Examiner—Sumati Krishnan
(74) Attorney, Agent, or Firm—Oliff & Berridge, PLC

(57) ABSTRACT

A light-emitting element includes a light-emitting layer including a base layer made of a first nitride semiconductor and plural island-shaped crystal portions made of a second nitride semiconductor, and an irradiation source of electron beam which is disposed so as to be opposite to the light-emitting layer. Then, electron-electron hole pairs in the light-emitting layer are excited through the irradiation of electron beam from the irradiation source, to generate and emit a light.

9 Claims, 1 Drawing Sheet

LIGHT-EMITTING ELEMENT

BACKGROUND OF THE INVENTION (1) Field of the Invention

This invention relates to a light-emitting element. Particularly usable for emitting a white light.

(2) Related Art Statement

As a light-emitting element for illumination, a normal light source such as a incandescent lamp and fluorescent lamp and also, a light-emitting diode (LED) which is made by stacking plural semiconductor layers are used. Since a white light includes three elementary colors, and can be emitted from the incandescent lamp or fluorescent lamp, the use of the incandescent lamp or fluorescent lamp enables a given object to be observed in full color.

On the other hand, since only a monochromatic light is emitted from the LED, and determined by the structure of the LED, the full color observation can not be realized. Recently, however, a LED to emit a white light are being developed actively. For example, such a white LED as using RGB or using two elementary colors constructed of a blue LED and yellow fluorescent substances coated on the blue LED is fabricated as prototypes.

Moreover, an ultraviolet LED is fabricated and then, a white LED is fabricated as prototypes, using fluorescence from the three elementary color fluorescent substances through the irradiation of an ultraviolet beam from the ultraviolet LED. This technique is based on the principle of a fluorescent lamp, and in this case, the ultraviolet LED is used in place of the mercury discharge inside the fluorescent lamp.

Moreover, since the white LED using RGB requires different LED chips, the cost rises, so that it has difficulty making it practicable for lighting. Then, since the white LED using two elementary colors can not be used for the full color observation because it utilizes only two elementary colors, not three elementary colors. Similarly, since the white LED using the ultraviolet LED requires the fluorescent substances of the three elementary colors, separately, the cost is risen. Then, if a GaN-based blue LED is modified into the ultraviolet LED so as to emit a light beam of shorter wavelength, the luminance efficiency is deteriorated remarkably.

Moreover, since the LED itself emit a light beam by utilizing a pn junction between the semiconductor layers, it has the inherent difficulty due to the pn junction control. Particularly, if such an attempt is made as to fabricate the LED of an AlGaInN-based semiconductor material, it is very difficult to fabricate a p-type semiconductor layer.

SUMMARY OF THE INVENTION

It is an object of the present invention to provide a new light-emitting element without the above-mentioned problems.

For achieving the above object, this invention relates to a light-emitting element, including a light-emitting layer including a base layer made of a first nitride semiconductor and plural island-shaped crystal portions made of a second nitride semiconductor, and an irradiation source of electron beam which is disposed so as to be opposite to the light-emitting layer, whereby electron-electron hole pairs in the light-emitting layer are excited through the irradiation of electron beam from the irradiation source, to generate and emit a light.

For achieving the above object, the inventors had been intensely studied, to obtain a new light-emitting element which is different in principle and structure.

In the light-emitting element according to the present invention, since the plural island-shaped crystal portions are created in the light-emitting layer, given carriers are confined in the island-shaped crystal portions. Therefore, if electron beams are irradiated from the irradiation source, the carriers are combined with given electron holes, effectively, and thus, a light of sufficient intensity can be generated and emitted.

Moreover, the binding energy between each carrier and each electron hole depends on the size of the island-shaped crystal portions to which the carrier and the electron hole belong. Therefore, if the plural island-shaped crystal portions are distributed in the base layer within a given range of size, the binding energies of the carriers and the electron holes are varied, which are combined in their respective island-shaped crystal portions and thus, a light of a given chromaticity or a white light can be generated and emitted. As a result, a light-emitting element to generate and emit a white light, which is difficult to be realized conventionally, can be easily obtained.

A carbon nano-tube may be used as the irradiation source of electron beam, and if the distance between the irradiation source and the light-emitting layer is set to be smaller, the light-emitting element can be illuminated below commercial voltage. Moreover, since the current required to drive the light-emitting element can be set to be extremely small, the electric power consumption can be reduced, compared with a incandescent lamp. Then, since such a harmful substance as mercury is not employed, there is no problem in waste disposal.

The island-shaped crystal portions are formed as follows, for example. That is, the in-plane lattice constant of the second nitride semiconductor to compose each of the island-shaped crystal portions is set larger than the in-plane lattice constant of the first nitride semiconductor to compose the base layer or the in-plane-lattice constant of a given nitride semiconductor to compose a base on which the island-shaped crystal portions are made. In this case, when the second nitride semiconductor is deposited on the base or in the base layer by a MBE method or the like, it may be affected by a compressive stress from the base or the base layer. As a result, the second nitride semiconductor is deposited in dot-like shape, and thus, the isolated island-shaped crystal portions are made.

The base is not an essential component in the present invention, but is used for the sake of convenience, in order to form the light-emitting layer of the light-emitting element according to the present invention. Therefore, the base may be removed by a given thermal treatment or a lapping treatment after the base layer and the island-shaped are formed on the base as mentioned above.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to the accompanying drawings.

Figure 1:
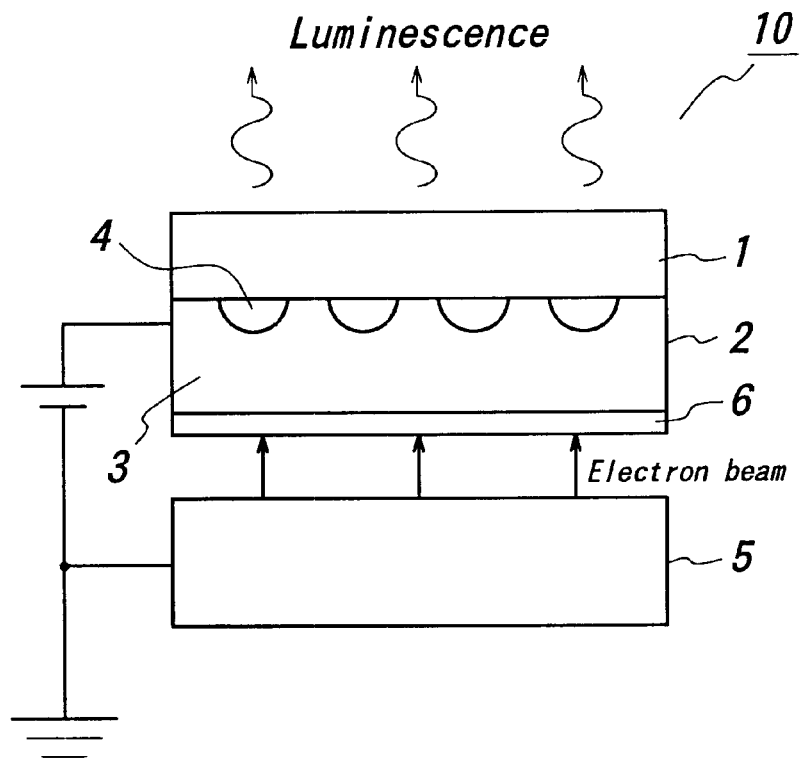
FIG. 1 is a structural showing a light-emitting element according to the present invention.

FIG. 1 is a structural showing a light-emitting element according to the present invention. A light-emitting element 10 depicted in FIG. 1 includes a transparent substrate 1 and a light-emitting layer 2 which is formed on the transparent substrate 1. The light-emitting layer 2 is comprised of a base layer 3 made of a first nitride semiconductor which has a composition of, e.g., $Al_xGa_yIn_zN$ ($0 \leq x, y, z \leq 1$, $x+y+z=1$) and plural island-shaped crystal portions 4 made of a second nitride semiconductor which has a composition of, e.g., $Al_pGa_qIn_rN$ ($0 \leq p, q, r \leq 1$, $p+q+r=1$).

Then, an irradiation source 5 of electron beam is provided so as to be opposite to the semiconductor layer 2, and an electrode 6 is provided on the main surface of the light-emitting layer 2 opposite to the irradiation source 5. Then, a given voltage is applied between the irradiation source 5 and the electrode 6 so that the irradiation source 5 is grounded and the electrode 6 is positively potentialized, thereby to irradiate electron beams for the light-emitting layer 2 from the irradiation source 5.

The space in between the irradiation source 5 of electron beam and the light-emitting layer 2 is evacuated into vacuum, and is held in a given vacuum degree, as occasion demands.

The electron beams from the irradiation source 5 are irradiated into and absorbed by the light-emitting layer 2, and thus, given carriers and electron holes, which are located in the island-shaped crystal portions 4, are re-combined, to generate and then, emit a light of a given wavelength from the transparent substrate 1 and the electrode 6.

As mentioned above, the binding energy between each carrier and each electron hole depends on the size of the island-shaped crystal portion to which the carrier and the electron belong. Therefore, by distributing the island-shaped crystal portions in the base layer 3 within a given range of size, a light of a given chroimaticity can be generated and emitted. For example, if the bottom surface of each island-shaped crystal portion is set within 5–30 nm, a white light can be generated and emitted.

In FIG. 1, the electrode 6 is provided on the main surface of the light-emitting layer 2, and then, a given voltage is applied between the electrode 6 and the irradiation source 5, to irradiate the electron beams for the light-emitting layer 2. Therefore, the light-emitting layer 2 can not be electrostatically charged and thus, the electron beams are irradiated for the light-emitting layer 2 stably for a long period of time. As a result, a light of a given chromaticity as desired can be generated and emitted stably for a ling period of time.

Moreover, a given element is doped into the light-emitting layer 2, to impart conductivity for the light-emitting layer 2, without the electrode 6. Then, the light-emitting layer 2 itself is grounded and set to the ground potential. In this case, too, given electron beams can be irradiated for the light-emitting layer 2. In addition, since the light-emitting layer 2 can not electrostatically charged, a light of a given chromaticity can be generated and emitted for a long period of time.

The transparent substrate 1 may be made of sapphire, quartz glass, other oxide material, ceramic material or semiconductor material. The electrode 6 may be generally made of a metallic film.

As the irradiation source 5 of electron beam, a beam source of AlN or $LaB_6$ may be employed, in addition to the above-mentioned carbon nano-tube. Then, if the distance between the irradiation source 5 and the light-emitting layer 2 is set to 1 mm or below, for example, the light emitting element 10 can be illuminated at a lower voltage than a commercial voltage. For example, if a commercial voltage of 100 V is employed, the electrical field strength is set to a higher value of 100 kV/cm.

In this embodiment shown in FIG. 1, the compositions of the first nitride semiconductor and the second nitride semiconductor, which make the base layer 3 and the island-shaped crystal portions 4 of the light-emitting layer 2, respectively, are set to $Al_xGa_yIn_zN$ ($0 \leq x, y, z \leq 1$, $x+y+z=1$) and $Al_pGa_qIn_rN$ ($0 \leq p, q, r \leq 1$, $p+q+r=1$), respectively. In this case, if the composition of the first nitride semiconductor and/or the second nitride semiconductor is varied, the band-gap of the first nitride semiconductor and/or the second nitride semiconductor can be varied. Therefore, the band-gap of the base layer 3 is set larger than that of the island-shaped crystal portions 4, and thus, the island-shaped crystal portions are excited effectively, to generate and emit a given light sufficiently.

An additive element such as Mg, Si, B may be incorporated as occasion demands. As elements or Sb elements may be partially substituted for N elements of the first nitride semiconductor and the second nitride semiconductor. Moreover, the first nitride semiconductor and second nitride semiconductor are not always made of a single crystal, but may be made of a polycrystal.

Figure 2:
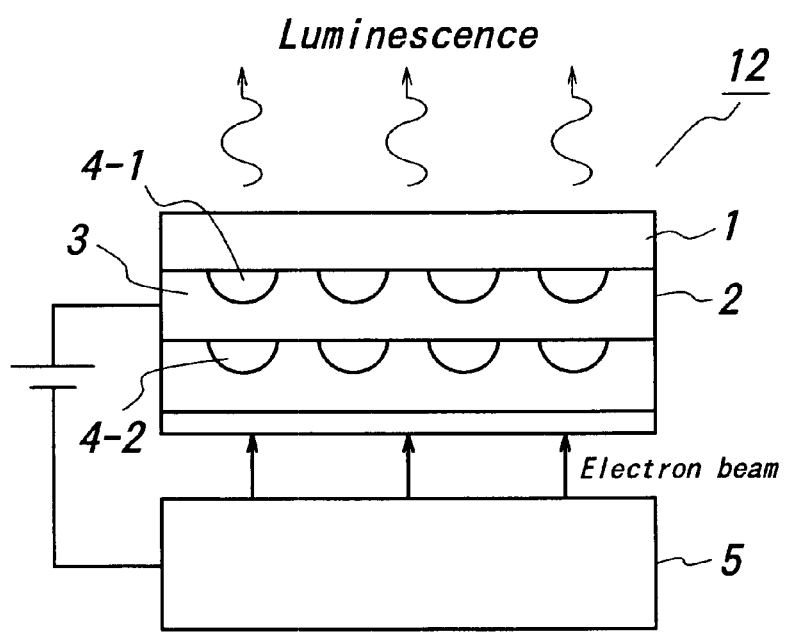
FIG. 2 is a structural view showing a modified light-emitting element from the one shown in FIG. 1.

FIG. 2 is a structural view showing a modified light-emitting element from the one shown in FIG. 1. In this embodiment, the same reference number is given to the component similar to the one in the above embodiment shown in FIG. 1. A light-emitting element 12 has the same structure as the one of the light-emitting element 10 shown in FIG. 1, except including island-shaped crystal portions 4-1 and 4-2 which are dispersed in two-stage. As shown in FIG. 2, if the island-shaped crystal portions are distributed in multistage, the absolute number of island-shaped crystal portion can be increased. Therefore, since the distribution range of size of island-shaped crystal portion can be increased, a light can be easily generated and emitted within a wide range of chromaticity. Also, a white light can be easily generated and emitted.

Although in FIG. 2, the island-shaped crystal portions are dispersed in two-stage, they may be done in three-stage or over.

In the light-emitting element according to the present invention, rare earth metal elements may be incorporated on the surfaces of the island-shaped crystal portions and/or into the island-shaped crystal portions. If the rare earth metal elements are excited through the absorption of an external light, they illuminate a fluorescence inherent thereto. Therefore, the rare earth metal element themselves function as a light-emitting layer, and thus, a light-emitting element using the fluorescence from the rare earth metal elements can be provided.

Moreover, if the luminescences from the island-shaped crystal portions and the rare earth metal elements are superimposed, a light of a given chroimaticity can be generated and emitted from the whole of the light-emitting layer.

As rare earth metal element to be used in the present invention, Tm to generate a light within blue color wavelength region, Er to generate a light within green color wavelength region and Eu or Pr to generate a light within red color wavelength region my be exemplified. Therefore, if these rare earth metal element are mixed appropriately at a given ratio, only the fluorescences from these rare earth metal elements are superimposed, to generate and emit a light of a given chromaticity, particularly a white light. The fluorescences may be superimposed with the luminescence from the island-shaped crystal portions. In this case, a light of a given chromaticity and thus, a white light can be easily generated and emitted.

The content of the rare earth metal elements is not restricted, but preferably, the rare earth metal elements are incorporated as much as possible, in order to generate the fluorescence in sufficient intensity. Concretely, the content of the rare earth metal elements is set within 0.01–7 atomic percentages.

The rare earth metal elements can be incorporated by irradiating the molecular beams of the rare earth metal elements at the formation of the base layer and/or the island-shaped crystal portions through MBE. Also, the rare earth metal element can be incorporated by using a raw material gas including the rare earth metal elements as component at the formation of the base layer and/or the island-shaped crystal portions through CVD. Moreover, after the base layer and the island-shaped crystal portions are made, the rare earth metal elements may be incorporated through implantation.

EXAMPLE

In this example, the light-emitting element 10 as shown in FIG. 1 was fabricated.

A sapphire single crystal substrate having a diameter of 2 inches and a thickness of 430 μm was employed as the transparent substrate 1. As solid sources, 7N—Ga source, 7N—In source and 6N—Al source were employed, and as nitrogen source, atomic-like nitrogen source, which was generated with a high frequency plasma generator by SVTA Ltd., was used.

The transparent substrate 1 was set in an MBE apparatus, and heated up to 700° C. Then, the base layer 3 made of an AlN layer was formed by using the Al source and the nitrogen source, and the island-shaped crystal portions 4 made of GaN were formed by using the Ga source and the nitrogen source, to form the light-emitting layer 2. The thickness of each of the island-shaped crystal portions 4 was 23 Å, and the average diameter of the bottom surfaces of the island-shaped crystal portions 4 was 80 Å. The total thickness of the light-emitting layer 2 was 5000 Å. Then, the electrode 6 was formed in a thickness of 1 μm on the main surface of the light-emitting layer 2.

Then, the irradiation source 5 of electron beam made of carbon nano-tube was disposed, so as to be opposite to the electrode 6, and then, electron beams were irradiated for the light-emitting layer 2. As a result, a white light of an intensity of 10 (lm/W) was generated and emitted.

Although the present invention was described in detail with reference to the above examples, this invention is not limited to the above disclosure and every kind of variation and modification may be made without departing from the scope of the present invention.

As mentioned above, according to the light-emitting element of the present invention, electron beams are irradiated for a light-emitting layer and then, island-shaped crystal portions in the light-emitting layer are excited, to generate and emit a given excitation light. Since the excitation light has an inherent chromaticity thereto, a light of a given chromaticity can be obtained. Moreover, if the island-shaped crystal portions are distributed within a given range of size, a white light can be easily obtained.

Moreover, since such a harmful substance as mercury is not selected, there is no problem in waste disposal. In addition, by selecting the irradiation source of electron beam appropriately and setting the distance between the irradiation source and the light-emitting layer to be smaller than a given value, the light-emitting element can be operated at a lower voltage than a commercial voltage, and thus, the electrical power consumption can be lowered remarkably.

What is claimed is:

1. A light-emitting element, comprising:

a light-emitting layer including a base layer made of a first nitride semiconductor and plural island-shaped crystal portions made of a second nitride semiconductor, and an irradiation source of electron beam which is disposed so as to be opposite to said light-emitting layer, whereby electron-electron hole pairs in said light-emitting layer are excited through the irradiation of electron beam from said irradiation source, to generate and emit a light.

2. A light-emitting element as defined in claim 1, further comprising an electrode layer on the main surface of said light-emitting layer, said electrode layer being positively potentialized for said irradiation source, whereby a given voltage is applied between said electrode layer and said irradiation source, to irradiate electron beams for said light-emitting layer from said irradiation source.

3. A light-emitting element as defined in claim 1, wherein said island-shaped crystal portions are distributed in said base layer within a given range of size, to generate and emit a light of a given chromaticity over said light-emitting layer.

4. A light-emitting element, comprising:

a light-emitting layer including a base layer made of a first nitride semiconductor and plural island-shaped crystal portions made of a second nitride semiconductor, and an irradiation source of electron beam which is disposed so as to be opposite to said light-emitting layer, wherein said island-shaped crystal portions are distributed in plural-stages in said base layer, to generate and emit a light of a given chromaticity over said light-emitting layer.

5. A light-emitting element as defined in claim 4, wherein said island-shaped crystal portions are distributed in plural-stage in said base layer, and even at each stage, said island-shaped crystal portions are distributed within a given range of size.

6. A light-emitting element, comprising:

a light-emitting layer including a base layer made of a first nitride semiconductor, plural island-shaped crystal portions made of a second nitride semiconductor and at least one rare earth element, and an irradiation source of electron beam which is disposed so as to be opposite to said light-emitting layer.

7. A light-emitting element as defined in claim 6, where said rare earth metal elements are composed of plural kinds of rare earth metal element.

8. A light-emitting element as defined in claim 6, wherein said rare earth metal elements are incorporated on the surfaces of said island-shaped crystal portions or into said island-shaped crystal portions.

9. A light-emitting element as defined in claim 1, wherein at least one of said first nitride semiconductor and said second nitride semiconductor has a composition of $Al_xGa_yIn_zN$ ($0 \leq x, y, z \leq 1$, $x+y+z=1$).

* * * * *